US009601168B2

(12) United States Patent
Shori et al.

(10) Patent No.: US 9,601,168 B2
(45) Date of Patent: *Mar. 21, 2017

(54) MEMORY BANK SIGNAL COUPLING BUFFER AND METHOD (71) Applicant: Micron Technology, Inc., Boise, ID (US)

(72) Inventors: Aidan Shori, Austin, TX (US); Sumit Chopra, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 220 days.

This patent is subject to a terminal disclaimer.

(21) Appl. No.: 13/846,452

(22) Filed: Mar. 18, 2013

(65) Prior Publication Data
US 2013/0215699 A1 Aug. 22, 2013

Related U.S. Application Data (63) Continuation of application No. 13/071,303, filed on Mar. 24, 2011, now Pat. No. 8,400,809, which is a
(Continued)

(51) Int. Cl.
| G11C 7/10 | (2006.01) |
| G11C 8/06 | (2006.01) |
| G11C 8/08 | (2006.01) |
| G11C 11/4094 | (2006.01) |
| G11C 11/4096 | (2006.01) |
| G11C 11/4097 | (2006.01) |

(52) U.S. Cl.
CPC .............. *G11C 7/1048* (2013.01); *G11C 8/06* (2013.01); *G11C 8/08* (2013.01); *G11C 11/4094* (2013.01); *G11C 11/4096* (2013.01); *G11C 11/4097* (2013.01)

(58) Field of Classification Search
CPC .......... G11C 8/06; G11C 8/08; G11C 11/4094; G11C 11/4096; G11C 11/4097; G11C 7/1048
USPC .... 365/189.05, 63, 189.17, 230.03, 189.011, 365/189.14
See application file for complete search history.

(56) References Cited

U.S. PATENT DOCUMENTS

4,154,978 A * 5/1979 Tu .......................... H04L 5/1461
178/71.1
4,883,989 A * 11/1989 Mizukami ........ H03K 3/356104
326/34
(Continued)

*Primary Examiner* — Vanthu Nguyen
(74) *Attorney, Agent, or Firm* — Dorsey & Whitney LLP (57) ABSTRACT A memory array contains a plurality of banks coupled to each other by a plurality of data lines. Each of the data lines is divided into a plurality of segments within the array. Respective bidirectional buffers couple read data from one of the segments to another in a first direction, and to couple write data from one of the segments to another in a second direction that is opposite the first direction. The data lines may be local data read/write lines that couple different banks of memory cells to each other and to respective data terminals, digit lines that couple memory cells in a respective column to respective sense amplifiers, word lines that activate memory cells in a respective row, or some other signal line within the array. The memory array also includes precharge circuits for precharging the segments of respective data lines to a precharge voltage.

19 Claims, 6 Drawing Sheets

Related U.S. Application Data continuation of application No. 12/353,661, filed on Jan. 14, 2009, now Pat. No. 7,929,329.

(56) References Cited

U.S. PATENT DOCUMENTS

| | | | |
|---|---|---|---|
| 5,225,722 A * | 7/1993 | Gotou | H03K 3/037 326/21 |
| 5,745,422 A * | 4/1998 | Iadanza | G11C 7/18 365/203 |
| 6,313,663 B1 * | 11/2001 | Mueller | B24B 9/065 326/58 |
| 6,489,808 B2 | 12/2002 | Iizuka | |
| 6,664,807 B1 * | 12/2003 | Crotty et al. | 326/40 |
| 6,882,555 B2 | 4/2005 | Fenstermaker et al. | |
| 7,142,442 B1 * | 11/2006 | Vadi et al. | 365/63 |
| 7,342,839 B2 * | 3/2008 | Barth, Jr. | 365/203 |
| 7,737,727 B2 | 6/2010 | Aranovsky | |
| 7,929,329 B2 | 4/2011 | Shori et al. | |
| 7,948,784 B2 * | 5/2011 | Kajigaya | 365/51 |
| 8,400,809 B2 | 3/2013 | Shori et al. | |
| 2003/0117878 A1 * | 6/2003 | Yamada | 365/230.03 |
| 2010/0177571 A1 | 7/2010 | Shori et al. | |
| 2011/0169534 A1 | 7/2011 | Shori et al. | |

\* cited by examiner

MEMORY BANK SIGNAL COUPLING BUFFER AND METHOD

CROSS REFERENCE TO RELATED APPLICATION(S)

This application is a continuation of U.S. patent application Ser. No. 13/071,303, filed Mar. 24, 2011, which application is a continuation of U.S. patent application Ser. No. 12/353,661, filed Jan. 14, 2009, and issued as U.S. Pat. No. 7,929,329 on Apr. 19, 2011. These applications and patent are incorporated herein by reference, in their entirety, for any purpose.

TECHNICAL FIELD

This invention relates to memory devices, and, more particularly, to a signal coupling buffer and method for coupling signals through a memory array.

BACKGROUND OF THE INVENTION

A wide variety of memory devices are in common use. Commonly used memory devices include dynamic random access memory ("DRAM") devices, static random access memory ("SRAM") devices, flash memory devices, and programmable read only memory ("PROM") devices, to name a few. All of these memory devices have certain properties in common. For example, the capacity and operating speed of such memory devices have continuously increased with time. Also, these memory devices utilize a large number of memory cells that are arranged in arrays or banks containing rows and columns.

Figure 1:
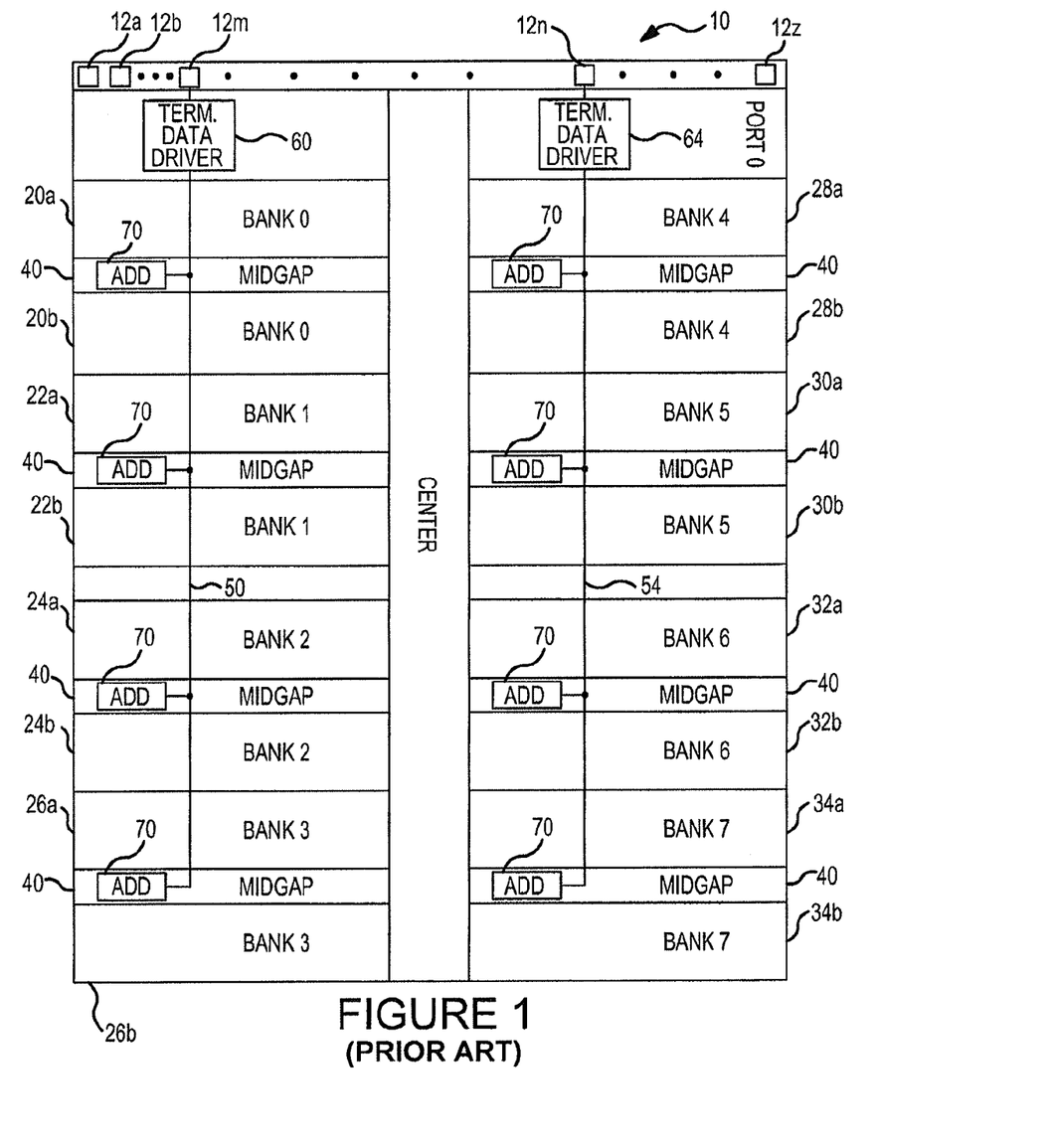
FIG. 1 is a block diagram of an architecture for a conventional memory device.

Each bank of memory cells can be thought of as a memory device "building block" so that the capacity of a memory device can be increased simply by increasing the number of banks in the memory device. For example, as illustrated in FIG. 1, an architecture for a memory device 10 includes a plurality of data terminals 12a-z for coupling write data to and read data from the memory device 10. The data terminals 12 typically number in powers of 2, with 8, 16 and 32 data terminals currently being common. Each data terminals 12 is selectively coupled to memory cells in the memory device 10. The memory device 10 contains 8 banks 20-34 of memory cells fabricated in an array area of a silicon substrate, with each bank being divided into two sections a,b by a respective midgap region 40. The memory cells in the low-order banks 20-26 are selectively coupled through a first plurality of common local data read/write ("LDRW") lines 50 to a first set of respective data terminals 12 on the left side of the memory device 10 as shown in FIG. 1. However, only a single LDRW line 50 connected to a single data terminal 12 on the left side is shown in FIG. 1 for purposes of clarity, it being understood that each data terminal 12 is connected to a respective LDRW line 50. Similarly, the memory cells in the high-order banks 28-34 are selectively coupled through a second plurality of LDRW lines 54 to a second set of respective data terminals 12 on the right-hand side of the memory device 10, although only one such line 54 is shown for purposes of clarity.

As shown in FIG. 1, the LDRW lines 50, 54 are connected to the respective data terminals 12 through respective terminal data drivers 60, 64, which may be of conventional or subsequently developed design. The terminal data drivers 60, 64 couple write data from the data terminals 12 to the respective LDRW lines 50, 54, and couple read data from the LDRW lines 50, 54 to the respective data terminals 12. Each bank 20-34 of memory cells also includes a respective array data driver ("ADD") circuit 70 that is fabricated in the midgap region 40 of the respective bank. The ADDs 70 may be conventional or subsequently developed circuitry. As is well known in the art, each of the ADDs 70 couple write data from the respective LDRW line 50, 54 to a respective input/output ("I/O") line (not shown), and couple read data from a differential sense amplifier (not shown) to the respective LDRW line 50, 54. As is well known in the art, the differential sense amplifier receives the read data from the respective I/O line.

As mentioned above, the capacity of memory devices can be increased simply by including a larger number of banks of memory cells. However, as the number of banks is increased, the lengths of the LDRW lines 50, 54 must be correspondingly increased as well. Unfortunately, the capacitance and resistance of the LDRW lines 50, 54 also increases with length, thus increasing the time required to couple data to and from memory cells in the banks, particularly those banks 26, 34 that are farther from the data terminals 12. As mentioned above, the operating speed of memory devices has also increased with time. Thus, the trend of increasing capacity is, to some extent, inconsistent with the trend toward higher operating speeds. For this reason, unless the problem of increased LDRW line capacitance and resistance can be solved, it may be necessary to trade off memory capacity for operating speed.

The problem of increased LDRW line capacitance and resistance potentially limiting memory device operating speed is also encountered in coupling data signals through data lines other than LDRW lines or other signal lines in memory arrays. For example, it is common for data lines known as bit lines or digit lines to extend through a memory array for coupling individual memory cells in the respective column of the array to a respective sense amplifier. The digit lines are, in turn, selectively coupled to the I/O lines. As the size of arrays continues to increase to provide increased memory capacity, the lengths of these digit lines are also increased, thus increasing their capacitance and resistance, which also tends to slow the operating speed of memory devices. Similar problems are encountered in coupling signals through other signal lines in an array, such as word lines.

There is therefore a need for devices and methods for more quickly coupling data signals through data lines such as LDRW lines and through other signal lines in memory arrays so that the capacity of memory devices can be increased without limiting operating speed.

DETAILED DESCRIPTION

Figure 2:
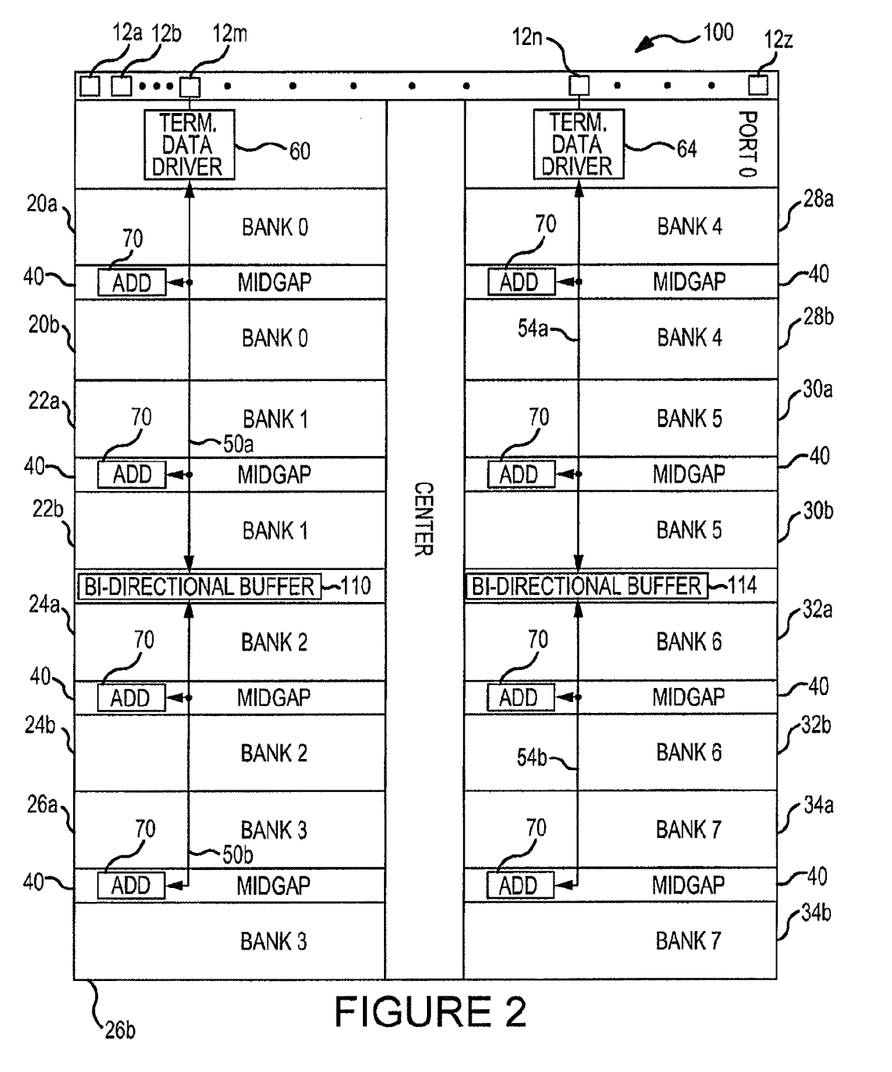
FIG. 2 is a block diagram of an architecture for a memory device architecture according to an embodiment of the invention.

An architecture for a memory device 100 according to an embodiment of the invention is shown FIG. 2. The memory device 100 includes the components of the memory device 10 shown in FIG. 1. Therefore, in the interests of clarity and brevity, these components have been provided with the same reference numerals, and an explanation of their structure and function will not be repeated. The memory device 100 differs from the memory device 10 shown in FIG. 1 by dividing each of the LDRW lines 50, 54 into two LDRW line segments 50a,b and 54a,b, respectively. A respective bidirectional buffer 110, 114 is connected between the two segments 50a,b and 54a,b, respectively. The bidirectional buffers 110, 114 function to couple signals through the respective LDRW lines 50 in either direction. As a result, for example, write data can be coupled from the data terminal 12m through the bidirectional buffer 110 to the ADD 70 of bank 24 or bank 26. Similarly, read data can be coupled from the ADD 70 of bank 26 or bank 24 through the bidirectional buffer 110 to the data terminal 12m. Moreover, the bidirectional buffers 110 can couple data in either direction between the LDRW line segments 50a and 54a and the respective LDRW line segments 50b and 54b without the need for decoding circuitry to selectively enable the buffer 110 and select the direction of signal transfer. In other words, the bidirectional drivers 110, 114 do not utilize two unidirectional buffers that are alternately enabled depending upon whether write data or read data are applied to the LDRW line 50. As a result, a relatively small amount of circuitry and fewer routes are required to implement the bidirectional buffers 110, 114.

Although the memory device 100 uses only one bidirectional buffer 110, 114 in each LDRW line 50, 54, it will be understood that other embodiments use a greater number of bidirectional buffers in each LDRW line 50, 54. For example, a memory device that uses a larger number of banks may intersperse a bidirectional buffer after every two banks. Also, although the bidirectional buffers 110, 114 are shown being used to couple signals between different LDRW line segments, it will be understood that they may also be used to couple signals to segments of other types of data lines within an array, such as digit lines, or to couple other signals through other lines within an array, such as to couple row signals through respective word lines.

Figure 3:
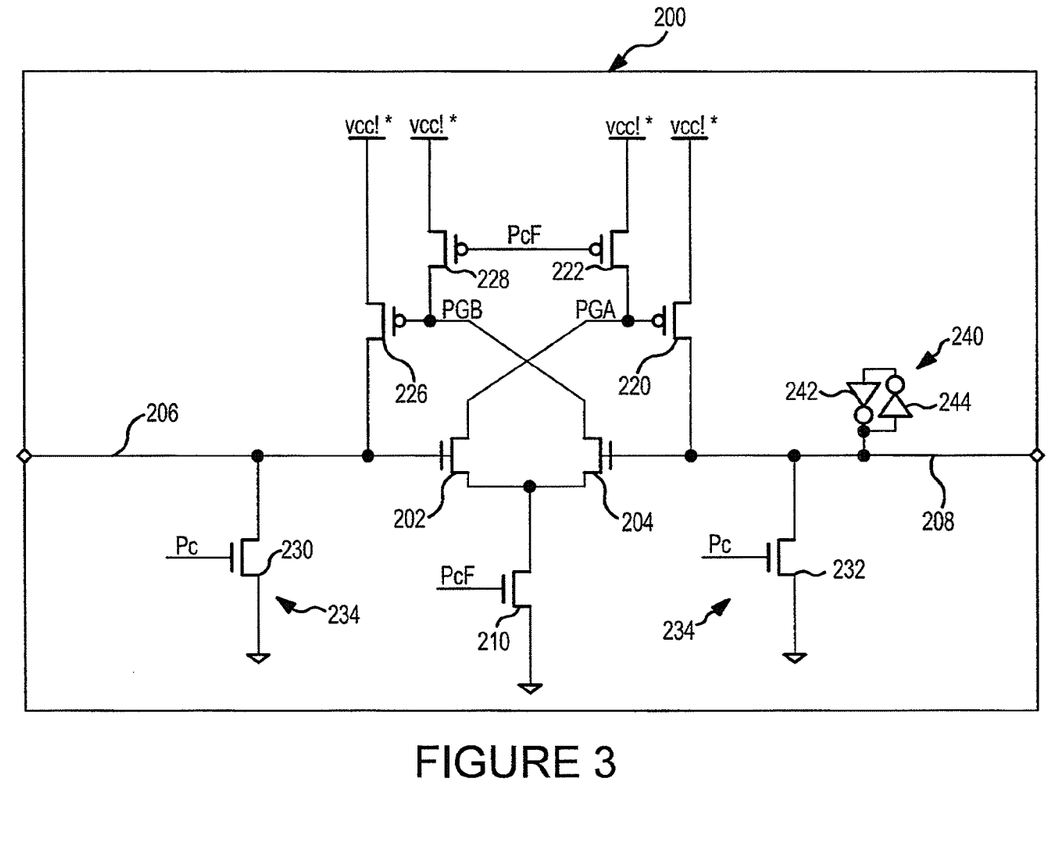
FIG. 3 is a schematic diagram of an embodiment of a bidirectional buffer that may be used in the memory device of FIG. 2.

One embodiment of a bidirectional buffer 200 that may be used for the bidirectional buffers 110, 114 is shown in FIG. 3. The bidirectional buffer 200 operates in either of two modes, namely a pre-charge mode in which a Pc signal is high and a PcF signal is low, and a read/write mode in which the Pc signal is low and the PcF signal is high. The buffer 200 includes a pair of NMOS transistors 202, 204 that have their gates coupled to respective segments 206, 208 of a respective LDRW line. The sources of the transistors 202, 204 are selectively coupled to ground through another NMOS transistor 210 that is turned ON in the read/write mode by a high PcF signal applied to the gate of the transistor 210. The drain of the transistor 202 is connected to both the gate of a PMOS transistor 220 and the drain of a second PMOS transistor 222. Similarly, the drain of the transistor 204 is connected to both the gate of a PMOS transistor 226 and the drain of a second PMOS transistor 228. The gates of the PMOS transistors 222, 228 are coupled to each other and are driven with the PcF signal so that they are turned OFF in the read/write mode when the PcF signal is high. Each LDRW line segment 206, 208 is connected to the drain of a respective NMOS transistor 230, 232, which implement a precharge circuit 234. The gates of the transistors 230, 232 are turned ON by the high Pc enable signal in the precharge mode. Finally, a latch 240 formed by two back-to-back inverters 242, 244 is connected to the LDRW line segment 208.

Figure 4:
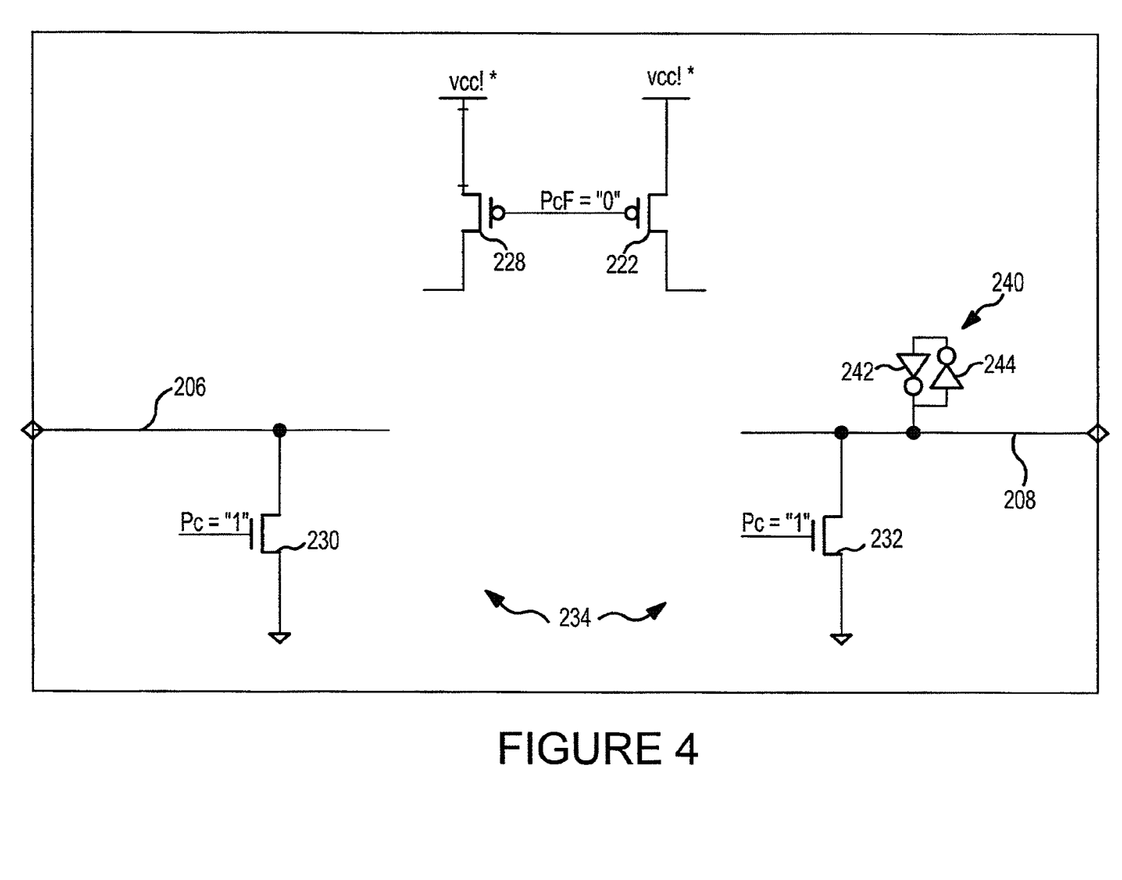
FIG. 4 is a schematic diagram of the bidirectional buffer of FIG. 3 as it is effectively configured when pre-charging a respective LDRW line instead of coupling read data or write data through the LDRW line.

The operation of the bidirectional buffer 200 will now be explained in each of its modes. In the precharge mode, the buffer 200 effectively assumes the configuration shown in FIG. 4. FIG. 4 shows the buffer 200 without the transistors that are turned OFF by the low PcF signal and the high Pc signal in the precharge mode. With reference, also, to FIG. 3, in the precharge mode the low PcF signal turns on the PMOS transistors 222, 228 thereby driving the gates of the PMOS transistors 220, 226 high to turn OFF the PMOS transistors 220, 226. For this reason, the transistors 220, 226 are not shown in FIG. 4. At the same time, the high Pc enable signal turns ON the NMOS transistors 230, 232 in the precharge circuit 234 thereby driving the LDRW line segments 206, 208 to ground. The ground applied to the LDRW line segments 206, 208 turns OFF the NMOS transistors 202, 204. Similarly, and the low PcF signal turns OFF the transistor 210. It is again for that reason the transistors 202, 204, 210 are not shown in FIG. 4. Thus, in the precharge mode, the LDRW line segments 206, 208 are driven to ground.

Figure 5:
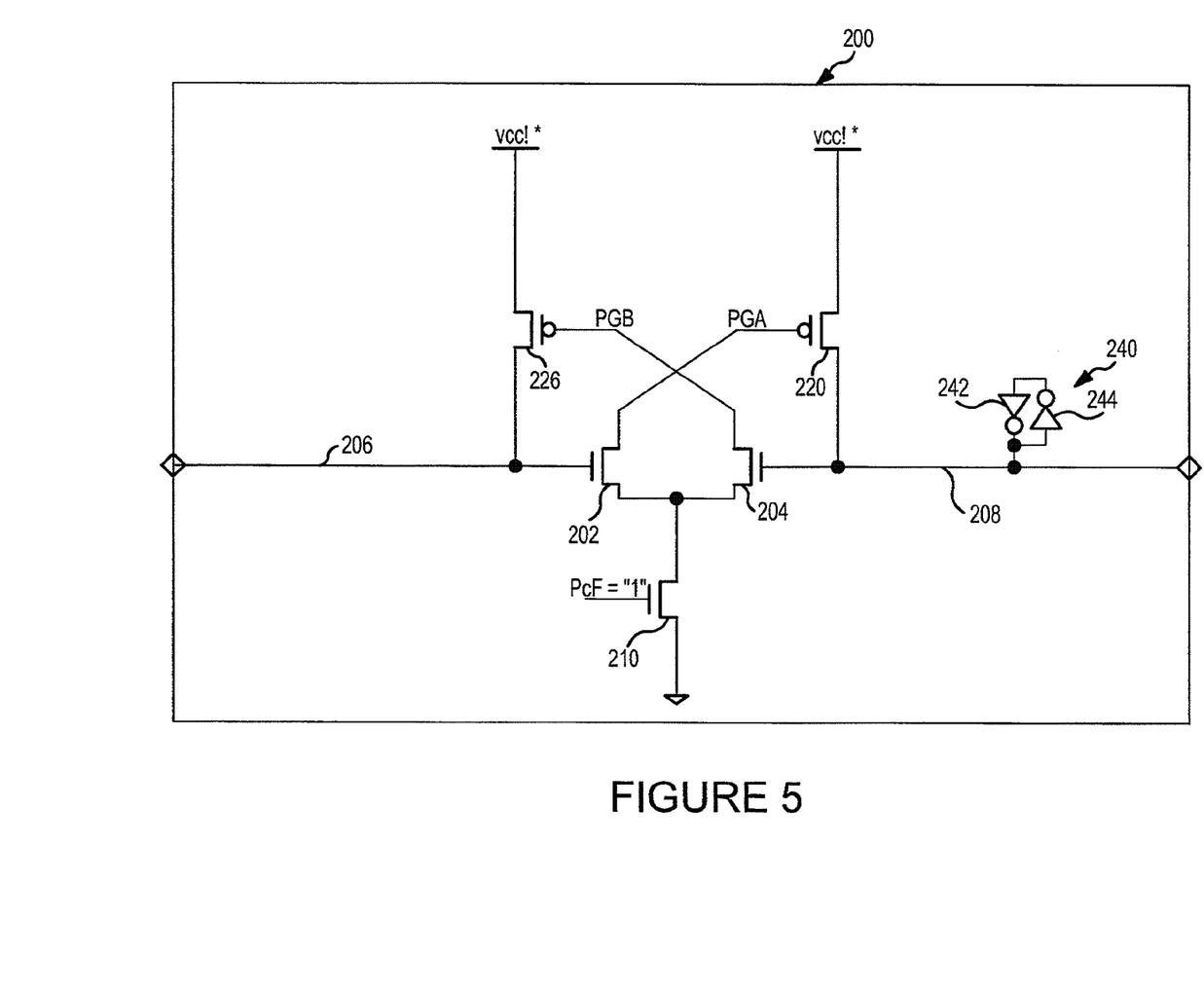
FIG. 5 is a schematic diagram of the bidirectional buffer of FIG. 3 as it is effectively configured when coupling read data or write data through a respective LDRW line.

The effective configuration of the bidirectional buffer 200 in the read/write mode is shown in FIG. 5 and with continued reference to FIG. 3. In the read/write mode, the high PcF signal turns OFF the PMOS transistors 222, 228, and the low Pc signal turns OFF the transistors 230, 232. As a result, these transistors 222, 228, 230, 232 are not shown in FIG. 5. When entering read/write mode, the LDRW line segments 206, 208 will have been precharged low, as explained above. Therefore, if a low data signal is applied to, for example, the line segment 206, the transistor 202 will remain in an OFF condition. As a result, latch 240 will keep the buffer 200 in its precharged state so that the other LDRW line segment 208 will remain low.

If, on the other hand, a high data signal is applied to the LDRW line segment 206, the NMOS transistor 202 will be turned ON, thereby pulling the gate of the PMOS transistor 220 low. The transistor 220 will then be turned ON thereby driving the LDRW line segment 208 high. Thus, the high data signal applied to the segment 206 is coupled to the segment 208. When the LDRW line segment 208 is driven high, it turns ON the NMOS transistor 204, which, in turn, turns ON the transistor 226 to maintain the line segment 206 high. This feedback effect also improves the speed of the rising edge of the line segment 206. Thus, the bidirectional buffer 200 essentially latches the LDRW line segments 206, 208 high. For this reason, the latch 240 is not needed to maintain the line segments 206, 208 high in the read/write mode, although it does serve to maintain the LDRW line segments 206, 208 low in the read/write mode after they have been precharged but before data signals have been applied to the bidirectional buffer 200. The bidirectional buffer 200 operates in essentially the same manner when a data signal is applied to the line segment 208 since the bidirectional buffer 200 is laterally symmetrical.

The bidirectional buffer shown in FIG. 3 is used when the LDRW lines 206, 208 are precharged low and driven high. However, it will be understood that bidirectional buffers according to other embodiments of the invention can be used when the LDRW lines 206, 208 are precharged high and driven low. For example, such bidirectional buffers can be implemented by substituting transistors of a first conductivity type for transistors of a second conductivity type, and vice-versa, where the second conductivity type is different from the first conductivity type. Specifically, NMOS transistors are substituted for the PMOS transistors used in the bidirectional buffer 200, and PMOS transistors are substituted for the NMOS transistors used in the bidirectional buffer 200. Instead of coupling the NMOS transistors to ground, equivalent PMOS transistors would be coupled to Vcc, and instead of coupling the PMOS transistors to Vcc, equivalent NMOS transistors would be coupled to ground. Other embodiments may be used to precharge the LDRW lines 206, 208 or other data or signal lines in an array to a different voltage, and the LDRW lines 206, 208 or other data or signal lines can be driven to different voltage levels as desired.

Figure 6:
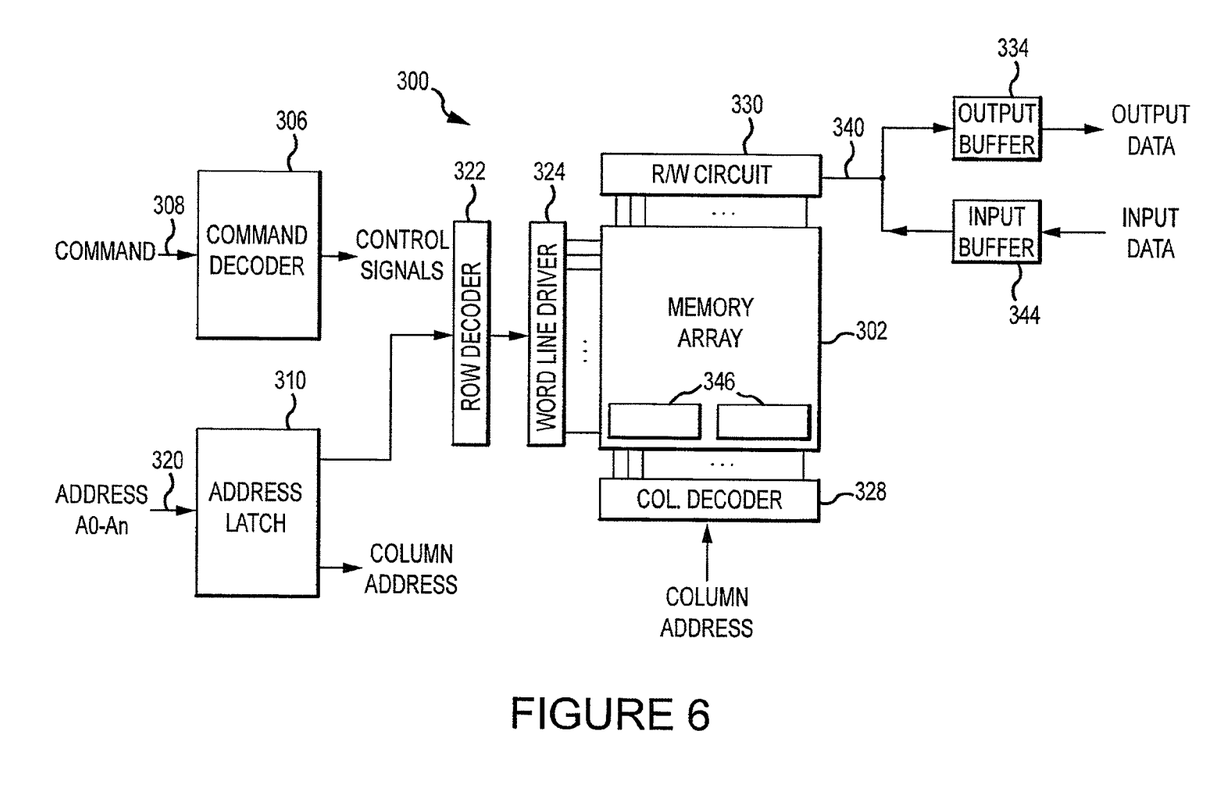
FIG. 6 is a block diagram of an embodiment of a memory device according to an embodiment of the invention.

FIG. 6 illustrates a portion of a memory device 300 according to an embodiment of the invention. The memory device 300 includes an array 302 of memory cells, which may be, for example, DRAM memory cells, SRAM memory cells, flash memory cells, or some other types of memory cells. The memory device 300 includes a command decoder 306 that receives memory commands through a command bus 308 and generates corresponding control signals within the memory device 300 to carry out various memory operations. Row and column address signals are applied to the memory device 300 through an address bus 320 and provided to an address latch 310. The address latch then outputs a separate column address and a separate row address.

The row and column addresses are provided by the address latch 310 to a row address decoder 322 and a column address decoder 328, respectively. The column address decoder 328 selects digit lines extending through the array 302 corresponding to respective column addresses. The row address decoder 322 is connected to word line driver 324 that activates respective rows of memory cells in the array 302 corresponding to received row addresses. The selected data line (e.g., a digit line) corresponding to a received column address are coupled to a read/write circuitry 330 to provide read data to a data output buffer 334 via an input-output data bus 340. Write data are applied to the memory array 302 through a data input buffer 344 and the memory array read/write circuitry 330. The command decoder 306 responds to memory commands applied to the command bus 308 to perform various operations on the memory array 302. In particular, the command decoder 306 is used to generate internal control signals to read data from and write data to the memory array 302.

Bidirectional buffers 346 according to embodiments of the invention are included in the memory array 302. In some embodiments, each of the LDRW lines are divided into at least two segments, and the bidirectional buffers 346 are interposed between adjacent segments of each LDRW line. In other embodiments, data lines in the array 302 other than LDRW lines, such as digit lines, are divided into at least two segments, and the bidirectional buffers 346 are interposed between adjacent segments of respective data lines. In still other embodiments, other signal lines in the memory array 302, such as, for example, word lines, are divided into at least two segments, and the bidirectional buffers 346 are interposed between adjacent segments of each word line. Other modifications will be apparent to one skilled in the art.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus comprising:
a plurality of data lines configured to provide respective signals within a plurality of memory cells, a data line of the plurality of data lines being divided into a plurality of data line segments; and
a bidirectional buffer interposed in the data line and connecting two data line segments of the plurality of data line segments to each other, the bidirectional buffer configured to bi-directionally provide data between the two data line segments, wherein the bidirectional buffer is configured, responsive to receiving a first data signal indicative of a precharge mode, to decouple the two data line segments from each other by disabling a first transistor coupled to a first of the two data line segments and disabling a second transistor coupled to a second of the two data line segments, wherein the bidirectional buffer is configured, responsive to receiving a second data signal indicative of an operation mode, to couple the first of the two data line segments to the second of the two data line segments by enabling the first transistor and enabling a third transistor via the enabled first transistor, and wherein the third transistor is coupled to the second data line segment.

2. An apparatus comprising:
a plurality of data lines configured to provide respective signals within a plurality of memory cells, a data line of the plurality of data lines being divided into a plurality of data line segments; and
a bidirectional buffer interposed in the data line and connecting two data line segments of the plurality of data line segments to each other, the bidirectional buffer configured to bi-directionally provide data between the two data line segments, wherein the bidirectional buffer is configured in a precharge mode, to decouple the two data line segments from each other by disabling a first transistor coupled to a first of the two data line segments and disabling a second transistor coupled to a second of the two data line segments,
wherein the first transistor includes a gate, a source, and a drain, and the gate of the first transistor is configured to be coupled to the first of the two data line segments,
wherein the second transistor includes a gate, a source, and a drain, the gate of the second transistor configured to be coupled to the second of the two data line segments, and the source of the second transistor is configured to be coupled to the source of the first transistor,
wherein the bidirectional buffer comprises a third transistor, the third transistor including a gate configured to be coupled to the drain of the second transistor, the drain of the third transistor configured to be coupled to the first of the two data line segments, and the source of the third transistor is configured to be coupled to a first voltage source, and
wherein the bidirectional buffer further comprises a fourth transistor, the fourth transistor including a gate coupled to the drain of the first transistor, the drain of the fourth transistor coupled to the second of the two data line segments, and the source of the fourth transistor is configured to be coupled to a second voltage source.

3. The apparatus of claim 2, wherein the first transistor and the second transistor comprise respective n-type metal-oxide semiconductor (NMOS) transistors.

4. The apparatus of claim 2, wherein the third transistor and the fourth transistor comprise respective p-type metal-oxide semiconductor (PMOS) transistors.

5. The apparatus of claim 2, wherein the source of the first transistor and the source of the second transistor are configured to be coupled to a common voltage source.

6. The apparatus of claim 5, wherein the common voltage source comprises a positive voltage source.

7. The apparatus of claim 2, wherein the bi-directional buffer further comprises:
  a fifth transistor including a gate configured to receive a first enable signal, a drain of the fifth transistor configured to be coupled to the gate of the third transistor, and a source of the fifth transistor configured to be coupled to a third voltage source; and
  a sixth transistor including a gate coupled to receive a second enable signal, a drain of the sixth transistor configured to be coupled to the gate of the fourth transistor, and a source of the sixth transistor configured to be coupled to a fourth voltage source.

8. The apparatus of claim 7, wherein the source of the fifth transistor and the source of the sixth transistor are configured to be coupled to a common voltage source.

9. The apparatus of claim 7, further comprising a seventh transistor including a gate configured to receive a third enable signal, a drain of the seventh transistor configured to be coupled to the source of the first transistor and the source of second transistor, and a source of the seventh transistor configured to be coupled to a fifth voltage source.

10. The apparatus of claim 7, further comprising a precharge circuit configured to precharge each of the two data line segments to a precharge voltage responsive to a precharge enable signal.

11. The apparatus of claim 10, wherein the precharge enable signal is provided to the precharge circuit having a first value while each of the first enable signal and the second enable signals has the first value, and wherein the precharge enable signal is provided to the precharge circuit having a second value while each of the first enable signal and the second enable signal has the second value.

12. The apparatus of claim 10, wherein the precharge circuit comprises:
  an eighth transistor including a gate configured to receive the precharge enable signal, a drain of the eighth transistor configured to be coupled to the first of the two data line segments, and a source of the eighth transistor configured to be coupled to a first voltage source; and
  a ninth transistor including a gate configured to receive the precharge enable signal, a drain of the ninth transistor configured to be coupled to the second of the two data line segments, and a source of the ninth transistor configured to be coupled to a second voltage source.

13. An apparatus comprising:
  a bidirectional buffer configured to decouple a first data line segment of a data line from a second data line segment of the data line, responsive to receiving a first data signal indicative of a precharge mode, by disabling a first transistor coupled to the first data line segment and disabling a second transistor coupled to the second data line segment, wherein the bidirectional buffer is configured to couple the first data line segment to the second data line segment, responsive to receiving a second data signal indicative of an operation mode, by enabling the first transistor and enabling a third transistor via the enabled first transistor, and wherein the third transistor is coupled to the second data line segment.

14. The apparatus of claim 13, wherein the bidirectional buffer comprises:
  a first precharge transistor configured to provide the precharge voltage to the first data line segment responsive to an enable signal having a first value; and
  a second precharge transistor configured to provide the precharge voltage to the second data line segment responsive to the enable signal having the first value.

15. The apparatus of claim 13, wherein the data line is configured to provide signals to a memory cell.

16. A method comprising:
  decoupling, via a bidirectional buffer, a first data line segment of a memory from a second data line segment of the memory responsive to receiving a first data signal indicative of a precharge mode, wherein decoupling, via the bidirectional buffer, the first data line segment from the second data line segment comprises disabling a first transistor coupled to the first data line segment and disabling a second transistor coupled to the second data line segment; and
  coupling, via the bidirectional buffer, the first data line segment to the second data line segment responsive to receiving a second data signal indicative of an operation mode, wherein coupling, via the bidirectional buffer, the first data line segment to the second data line segment, comprises enabling the first transistor and enabling a third transistor via the enabled first transistor, wherein the third transistor is coupled to the second data line segment.

17. The method of claim 16, wherein coupling the first data line segment to the second data line segment comprises coupling the first data line segment to the second data line segment after precharging the first data line segment and the second data line segment to a precharge voltage.

18. The apparatus of claim 13, further comprising:
  a precharge circuit configured to precharge the first data line segment and the second data line segment to a precharge voltage while in the precharge mode.

19. The method of claim 16, further comprising precharging the first data line segment and the second data line segment to a precharge voltage while the first data line segment is decoupled from the second data line segment.

* * * * *